United States Patent [19]

Ishman et al.

[11] 3,891,926

[45] June 24, 1975

[54] FILTER MODULE

[75] Inventors: Neal H. Ishman, Springfield; Richard W. Lenert, Annandale, both of Va.; Jeffrey B. Goldman, Rockville, Md.

[73] Assignee: American Standard, Inc., McLean, Va.

[22] Filed: Dec. 18, 1972

[21] Appl. No.: 315,818

[52] U.S. Cl. ................ 325/159; 325/174; 325/177; 325/187; 333/17

[51] Int. Cl. ............................................ H04b 1/04

[58] Field of Search ........... 325/144, 159, 184, 187, 325/174, 177, 171, 172, 173, 175; 333/70, 17; 334/7

[56] References Cited

UNITED STATES PATENTS

| | | | |
|---|---|---|---|
| 2,376,667 | 5/1945 | Cunningham et al. | 325/177 |
| 3,271,684 | 9/1966 | Simon | 325/175 |
| 3,454,881 | 7/1969 | Fletcher | 325/177 |
| 3,643,163 | 2/1972 | Bruck | 323/177 |
| 3,715,690 | 2/1973 | Young et al. | 333/17 |

*Primary Examiner*—Howard W. Britton
*Assistant Examiner*—Jin F. Ng
*Attorney, Agent, or Firm*—Hyman Hurvitz

[57] ABSTRACT

A radio transceiver, capable of transmitting and receiving in any of a large number (7000.) of channels over a band of frequencies almost an octave wide in the u.h.f. spectrum, which includes a tunable frequency synthesizer operable over the band 225–400 MHz., in 25 KHz. channel spacings, a driver amplifier responsive to the synthesizer over the entire band, a filter of the multi-cavity resonator type continuously tunable over the band and a broad band power amplifier responsive to the output of the filter, amplitude modulation of carrier derived from the power amplifier being achieved at the driver amplifier in response to an error signal equal to the difference between a rectified version of the output of the power amplifier and an audio input signal. Since the cavity resonator presents a load to the driver amplifier which looks like a short circuit when the filter is not correctly tuned, the driver output stages, operating Class C, are bypassed during tuning, drive during tuning being achieved from Class A drivers of the Class C stages until the filter is completely tuned, and in the latter process rough tuning being achieved in terms of a comparison of power reflected from the input of the filter and issuing out of the filter, and fine tuning being achieved in response to phase comparison of the signals at the input and issuing out of the filter.

The filter is tuned by a reversible drive motor, which runs the filter through its range. Reflected and output signal amplitudes at the filter are compared to derive a maximum output amplitude signal, which renders logic circuitry responsive to measurements of phase difference between input and output signals. Phase differences achieve plural zeros in passing into and out of the resonance frequency of the filter and logic circuitry is provided which causes repeated reversals of the motor, with progressively descreasing speed, in response to phase differences, as tuning passes from one side to the other of a true zero, until the motor comes to rest.

12 Claims, 7 Drawing Figures

FILTER MODULE

BACKGROUND

It is old and well known to tune radio transmitters having tuned output stages to the frequency of a driving oscillator, as in the U.S. Patent to Bruene, No. 3,355,667, issued Nov. 28, 1967. It is not known, so far as applicants are aware, to automatically tune resonant cavities to the frequency of a synthesizer over nearly an octave wide band and to drive the cavities by means of a modulated Class C amplifier, after tuning, but in response to a Class A unmodulated amplifier during tuning. Tuning involves driving a load, i.e., the resonant cavities having a range of values extending from essentially zero to a value of about 50. ohms. At zero load the Class C amplifier would be seriously mismatched and therefore be subject to burn out, which is not a property of Class A amplifiers since they are operating at lower power levels and have considerable internal feedback in that these stages utilize bypassed emitter resistors as a part of the bias circuitry. The power of the driver amplifier must be substantially constant over the frequency band which it must amplify, for a wide range of load values, since comparative power levels are utilized in the present system to control a motor which varies the tuning of the cavity filter, and power levels will depend on the load seen by the amplifier. Therefore, it is not feasible to drive the cavity from a Class C amplifier during tuning. Instead the filter cavity is driven directly from a low power Class A stage, during tuning, and the latter drives the Class C stage which in turn drives the filter cavity only after tuning is complete. The Class A stage is a low power stage, and moreover is so designed that it can provide reasonably level power over the band of interest to the filter, regardless of load presented by the latter. Thereby it becomes feasible to approximately or roughly tune the filter by comparison of power reflected from the input of the filter with power out of the filter. After turning is nearly complete, fine tuning is accomplished by comparing phase of voltage into the filter with phase of voltage out, and for zero phase difference tuning is precise.

The motor which effects tuning has considerable inertia, and the carrier must ultimately be precisely at the center of the filter pass-band. The loaded Q of the filter is about 400., so that its bandwidth 3db down from peak may be about 1. MHz. Turning must therefore be accomplished to within about 15° electrical, in order to consider the filter centered on the input frequency. The tuning motor tends, due to its inertia, to overshoot the required tuning, and therefore logic is provided which causes the motor to return after each overshoot, but with progressively smaller overshoots until the required accuracy is achieved. This logic must operate over almost an octave of filter tuning, i.e., from 225. mHz. to 400 mHz., yet is particularly effective because it depends on comparisons of amplitudes of responses of two amplitude detectors connected respectively at the input and output of the filter, and on the output of a phase detector responsive to signals respectively applied to and derived from the filter. However, instead of amplitude comparison, one might use amplitude of output only.

It is required that the transmitter be unmodulated until it is fully tuned, both to avoid undesirable transmissions and because of the character and details of the modulation system employed. Application of modulation is, therefore, timed to occur only after the filter is tuned. At that time the Class C amplifier is connected in circuit and the modulator connected. The power output amplifier of the system is not modulated, but is driven from a regulated voltage supply, Class C. Modulation is accomplished by detecting output of the power amplifier output stage, and comparing the detected output with audio input, to derive an error signal. The latter modulates the Class C driver amplifier where modulation can occur at low level, yet by virtue of the feedback present any distortion generated by the Class C driver, by the filters present in the transmitter and in the power amplifier, is largely removed. It is also advantageous, from the point of view of reduction of modulating power, and reduction of heat dissipation, that modulation occur in the driver. However, if the modulator were connected at full power when the Class C driver was initially placed in circuit the error signal could be transiently very large because the feedback circuit requires a finite time to stabilize, and the Class C amplifier could therefore be overdriven and burnt out, or the power amplifier overdriven, with the same effect. Therefore, when the Class C amplifier is initially connected in circuit the modulator is maintained at low B+ level, and the latter level then increased sufficiently slowly to enable the feedback loop to stabilize and to hold the Class C driver at its correct level.

Provision is also made in the present system for avoiding lock, by the tuning motor, on spurious responses of the cavity filter, which derive from the fact that the filter may include three cascaded cavities, in one specific embodiment. Such a filter has a response curve in which input and output can have 0° phase difference for frequencies at three positions in the band of interest. Therefore the phase detector of the system can have two spurious responses and one correct response, and the incorrect resonses must be negated by suitable logic. Additionally the phase detector is amplitude sensitive as are all phase detectors, i.e., it provides zero output if one input is zero, regardless of relative phase. As a further problem the phase detector includes two diodes. If the latter do not have precisely matched I v E characteristics, the phase detector may provide a zero phase response when in fact phase difference of its inputs is not zero degrees.

MODULATION SYSTEM

Figure 1:
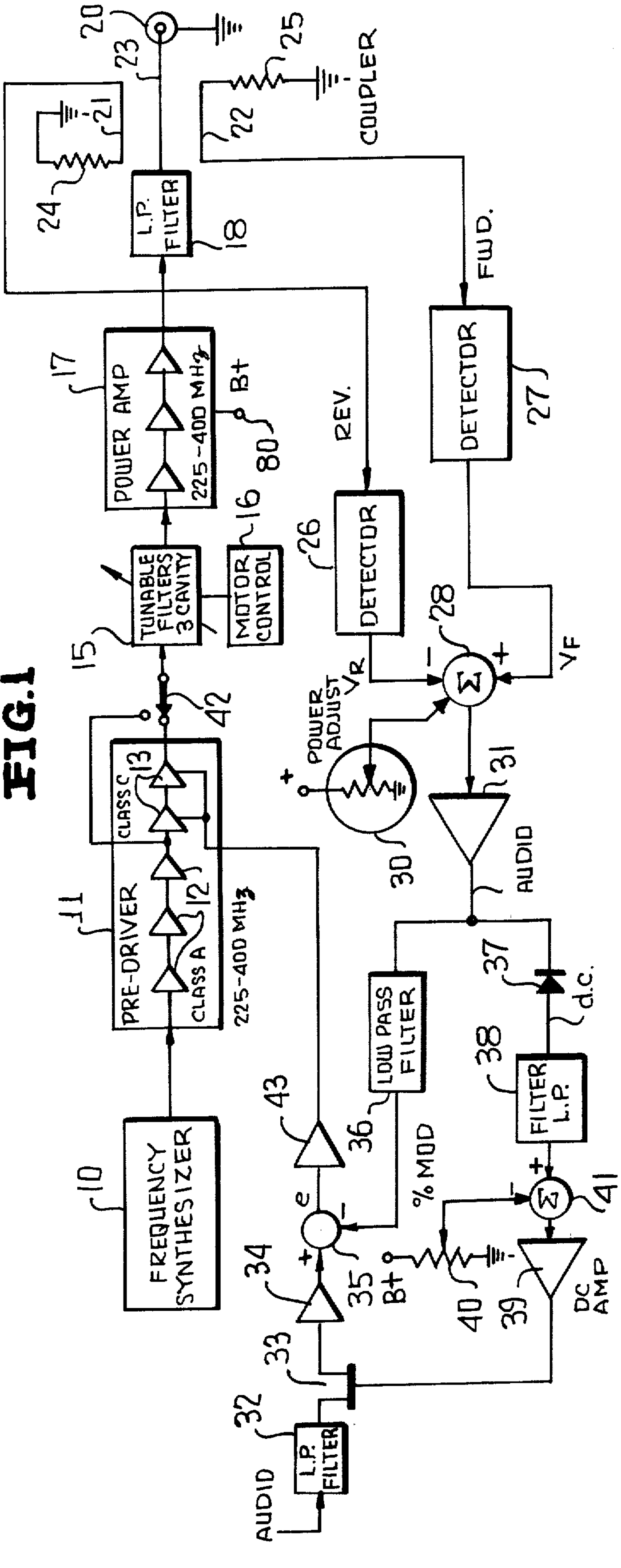
FIG. 1 is a block diagram of a modulator according to the invention, having a tunable filter module.
Figure 4:
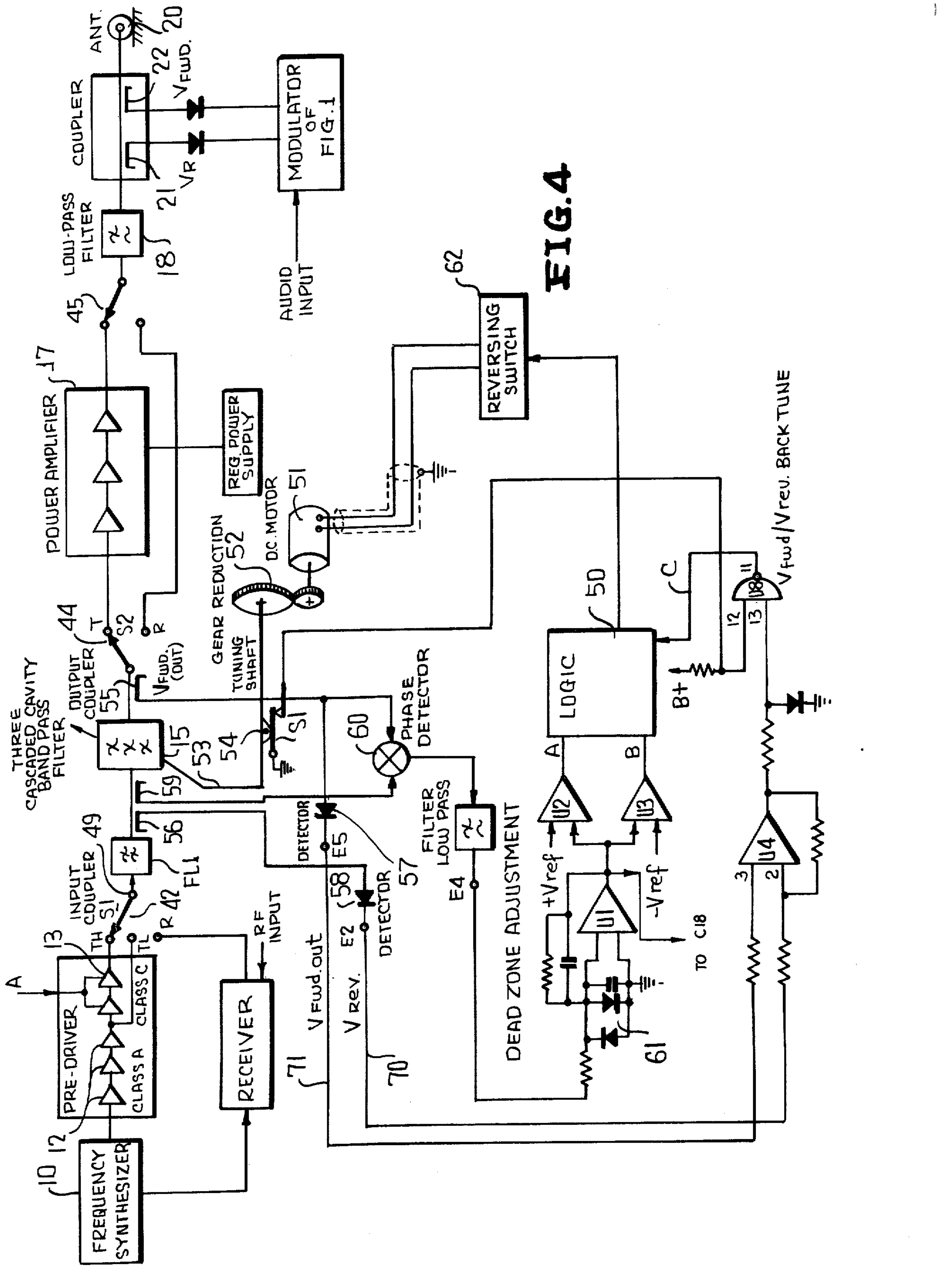
FIG. 4 is a diagram partly in block and partly schematic of expanding the system of FIG. 1.

In FIGS. 1 and 4, 10 is a frequency synthesizer, capable of providing any one of 7000 frequencies equally spaced in the band 225 MHz to 400 MHz. The frequency synthesizer 10 drives a predriver 11 which is an amplifier consisting of three cascaded Class A stages 12, followed by two cascaded Class C stages, 13. The output of the pre-driver in turn drives a low pass 400 MHz. filter FL1 (FIG. 4) and then a narrow band tunable filter 15, consisting of three cascaded capacitively tuned helix cavities. These are concurrently tunable over the band 225 MHz. to 400 MHz. by means of a motor control 16. The output of filter 15 drives a broad band power amplifier 17, which is powered by a regulated B+ source 80, and amplifies with nearly equal gain over the aforementioned band. The output of power amplifier 17 is passed through a low pass filter 18, cutting off at 400 MHz, to eliminate harmonics of the carrier, and the filter 18 output proceeds to an output terminal 20, which may be connected to an antenna (not shown.)

Couplers 21 and 22 are coupled to output line 23, coupler 21 being a reverse coupler and 22 a forward coupler. These are ¼ λ long at midband, where λ is the operating wavelength and are terminated with 50 ohm resistances 24, 25, respectively, to match the impedance of line 23. The signals picked up by the couplers are detected in opposite polarities by detectors 26, 27, respectively, and the outputs are applied to a summing circuit 28, which provides a replica of the modulations on the carrier at terminal 20. The power adjust 30 determines at what level output signal shall emerge from summing circuit 28, and the summed signal is amplified through amplifier 31.

An audio signal, or other equivalent signal, is applied via a low pass filter 32, which limits the audio speech band to a desired value, and via a voltage sensitive attenuator 33, and an isolating amplifier 34, to a summing circuit 35, to which is also applied the output of low pass filter 36. The difference signal is applied via amplifier 43 to modulate Class C amplifier 13.

The output of audio amplifier 31 is rectified in diode 37, smoothed to dc in low pass filter 38, and applied by dc amplifier 39 to the gate electrode of electronic attenuator 33. The dc level applied to dc amplifier 39 may be controlled by adding to its input a dc voltage from adjustable dc source 40, via summing circuit 41. The circuit from 31 through 36 (low pass filter to the negative input of summation node 35) is dc through audio coupled and represents an audio feedback circuit. Change of dc level by pot 30 will change the dc reference level and therefore RF power. The second loop including 37, 38, 41 and 39 to 33 is the % modulation level. Polarity of the diode 37 is such that it detects the valley of the modulation signal which is identified as dc in FIG. 3. Low pass filter 38 smooths the ripple of the audio signal and its harmonics generated in the detection process. The dc level from the low pass filter 38 therefore represents per cent modulation. This is summed with a dc voltage from pot 40. Because the dc from 40 can either add or subtract from dc out of 38, it serves as a control of per cent modulation. Amplifier 39 supplies the dc level to the gate of a FET 33 which serves as a voltage variable resistor. When the dc level proportional to per cent modulation becomes too high indicating that per cent modulation is decreasing, the resulting dc level from 39 to 33 will turn the FET on to lower the source to drain resistance thus coupling more audio signal from 32 to 34. This increased level into the modulation portion of the loop at the positive input to 35 and will force an increase in per cent modulation.

A switch 42 is provided, to enable the tunable filter 15 to be driven either from the Class A stages 12 or from the Class C stages 13, at will. A low pass filter, FL1 in FIG. 4, is connected in the output from 13 to 15 to reject the second harmonic generated in 12. Second harmonics produces false reflection power causing tuning problems if this second harmonic is not suppressed.

A Class C amplifier is required to drive filter 15, in order to achieve power output with high efficiency and to enable modulation. Several watts output is required at zero modulation, for application of the present system. The filter has an insertion loss of about 50%, so that it is desirable that the filter 15 be driven at a low power point of the system. To have located the filter following the power amplifier 17 would have been wasteful of power. At the same time Class C stages 13 are susceptible to modulatioon at low power, whereas power amplifier 17 would require high power modulation, which in itself introduces high loss into the system.

Yet, the primary function of the narrow band filter 15 is to provide selectivity to discriminate against the undesired noise characteristic of wide band frequency synthesizers and subsequent broad band amplifiers in a transmitter chain. Accomplishment of this end requires proper positioning of the filter in the amplifier chain. If the filter is too near the frequency synthesizer, broad band noise generated in the broad band low level amplifier stages will not be attenuated at the transmitter output. Trade-off between total power lost in the filter and the noise figure desired is therefore required.

While the filter 15 is de-tuned, it is seen by the predriver as a short circuit. The Class C amplifiers 13 of the predriver 11 are relatively high power devices and must be susceptible to modulation. For a very low load output impedance all the r.f. power of the Class C amplifiers 13 must be absorbed by the transistors of the amplifier, which then become susceptible to burnout. To avoid the likelihood of burnout, the filter 15 is connected to the Class C stages 13 only after tuning is accommplished. Switch 42 enables either amplifiers 13 or 12 to be connected to drive 15, at will.

The Class C amplifiers 13 are driven from the additive error circuit 35. Accordingly, amplifier 43 supplies all the modulating power required. Modulation is accomplished by a closed loop feedback circuit, in the present system, which then minimizes any discrepancy between amplitude modulation on the carrier and input signal in the audio source.

Figure 2:
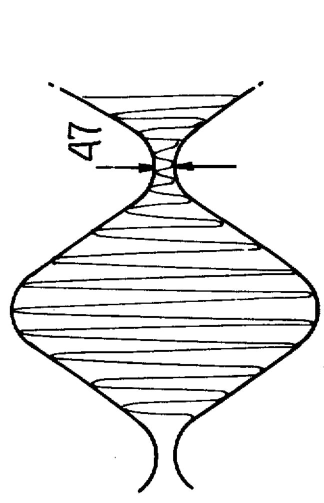
FIG. 2 is a waveform of a modulated carrier produced by the system of FIG. 1.
Figure 3:
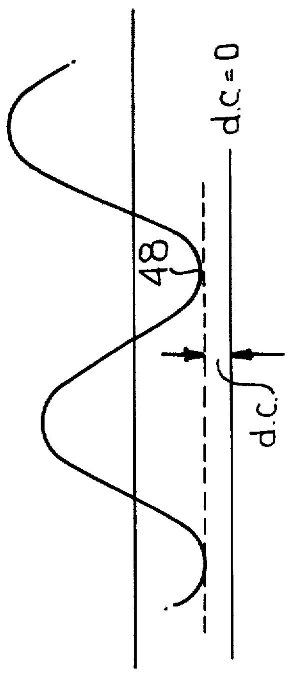
FIG. 3 is a waveform of a detected version of the waveform of FIG. 2.

The rectifier 37, by virtue of its polarity, senses the value of the low level of the amplitude modulated signal, i.e., 47 of FIG. 2, representing modulated r.f. signal, or 48 of FIG. 3, representing the output of audio amplifier 31. The output of dc amplifier 39 controls the attenuation introduced by voltage controlled attenuator 33, exemplified by a FET.

The FET 33 then intervenes only when overmodulation would occur, and the level of the dc inserted into adder 41 determines the percentage modulation which shall occur or be permitted. Overmodulation can occur because the predriver 11 and the power amplifier 17 may have different gains at different portions of the band of interest, or because the insertion loss of the filter 15 is not uniform over the band of interest, or because of extreme changes in the level of the modulating signal. Performance realized in the present system held the modulation between 85% and 95% (within 1 db) as the audio input signal level is varied from −15dBm to +10 dBm (an input signal level variation of 25 db.) The dc source 40 inserts a positive bias into amplifier 39, which is overcome only when the negative peak of the feedback audio signal attains a value such as to overbalance the bias. The system therefore cannot over-modulate for wide variations of audio input signal levels and other parameters.

In FIG. 4 is illustrated a filter tuning circuit according to the invention, involving a reversing switch 62, which responds to logic circuits to mechanically tune filter 15 to the same frequency as is produced by frequency synthesizer 10. FIG. 4 in part repeats FIG. 1 but adds the required motor control circuit which in turn includes logic circuitry 50, illustrated in detail in FIG. 6.

The motor 51 is a reversible dc motor which drives filter 15 via gears 52 and tuning shaft 53. The latter drives a cam 54 which operates a switch $S_1$.

When the system is switched to transmit, at switch 42, the switch arm of switch 42 is initially at TL, connected to the output of Class A amplifier 12. About 0.75 watt is applied at point 49, the input of low pass filter $FL_1$ from the predriver 12. $FL_1$ cuts off slightly above 400. MHz so that essentially no harmonics of the carrier frequency pass to tunable filter 15. The forward-propagated signal at the output of filter 15 is detected by coupler 55. The r.f. signal reflected at the input of the filters is detected by coupler 56. These voltages are rectified to provide positive voltages, by rectifiers 57 and 58, respectively, and the positive voltages are applied to sense comparator $U_4$, which is a comparator amplifier.

The unrectified outputs of couplers 55 and 59 are also applied to phase detector 60, and the output of the latter, which may be positive or negative, is clipped in a two-sided clipper 61, which operates to protect against overvoltage, and the clipped voltage applied to phase detector amplifier $U_1$.

Drive voltage is supplied to motor 51 from a reversing switch 62. The motor can accordingly run forwardly or backwardly according to the state of the switch 62 or can be turned off by the switch 62.

The motor 51, when rotated, causes tunable filter 15 to tune through its frequency range of 225 to 400 MHz. The filter itself is a known capacitor tunable helix cavity filter and has three sections in cascade, and therefore three tuning capacitors, one for each section, each having rotary plates (not illustrated.) These plates are required to move through an arc of 160°, to effect the required tuning range and outside this arc the tuning is not utilized. Cam operated switch $S_1$ is maintained open while the tuning capacitors are rotated through the valid 160° arc and closed otherwise. In its open position, switch $S_1$ leaves high voltage at terminal 12 of NAND gate $U_8$ and enables its output. When the switch $S_1$ is open, the output of power sense comparator $U_4$ is applied to $U_8$ so that $U_8$ provides a low only if $U_4$ provides a high and if $S_1$ is open. To summarize, when the filter is in its valid 160° range, switch $S_1$ is open and otherwise closed. When open, $U_8$ can be activated. Similarly, if the VSWR at 56 is high and the output of the filter low, a logic low voltage is applied to the 13 input of $U_8$ and $U_8$ is inhibited; hence, high. Therefore, a high output from $U_8$ indicates that the tuning capacitor is in a proper tuning range (forcing pin 12 high) and that the tuning is nearly correct, i.e., within the range for which $U_4$ produces a high output as indicated at plot j of FIG. 5. The function of $U_8$ is to render phase measurement effective only when the filter is nearly tuned to its input frequency, i.e., overthe slope *a* of curve e of FIG. 5. However, over this range tuning is not sufficiently accurate and resort to phase measurement is required to achieve accurate tuning, i.e., one must find the intercept of *a* with the curve axis of plot *e*.

In the receive mode of the system no tuning takes place but switch 42, switch 44, and switch 45 are applied to contact R transferring the antenna signal to the receiver input through filter 15 which is previously tuned to a desired frequency. Also, in receive, the synthesizer 10 is converted to local oscillator frequency for the receiver.

If the filter 15 is badly detuned, when switch 42 is set to transmit there will be little signal out of the filter and large VSWR and power reflection from its input. Lead 70 will then carry a large voltage and lead 71 a small voltage. Comparator $U_4$ will sense this imbalance and develop a low voltage into $U_8$, which then provides high output.

Figure 5:
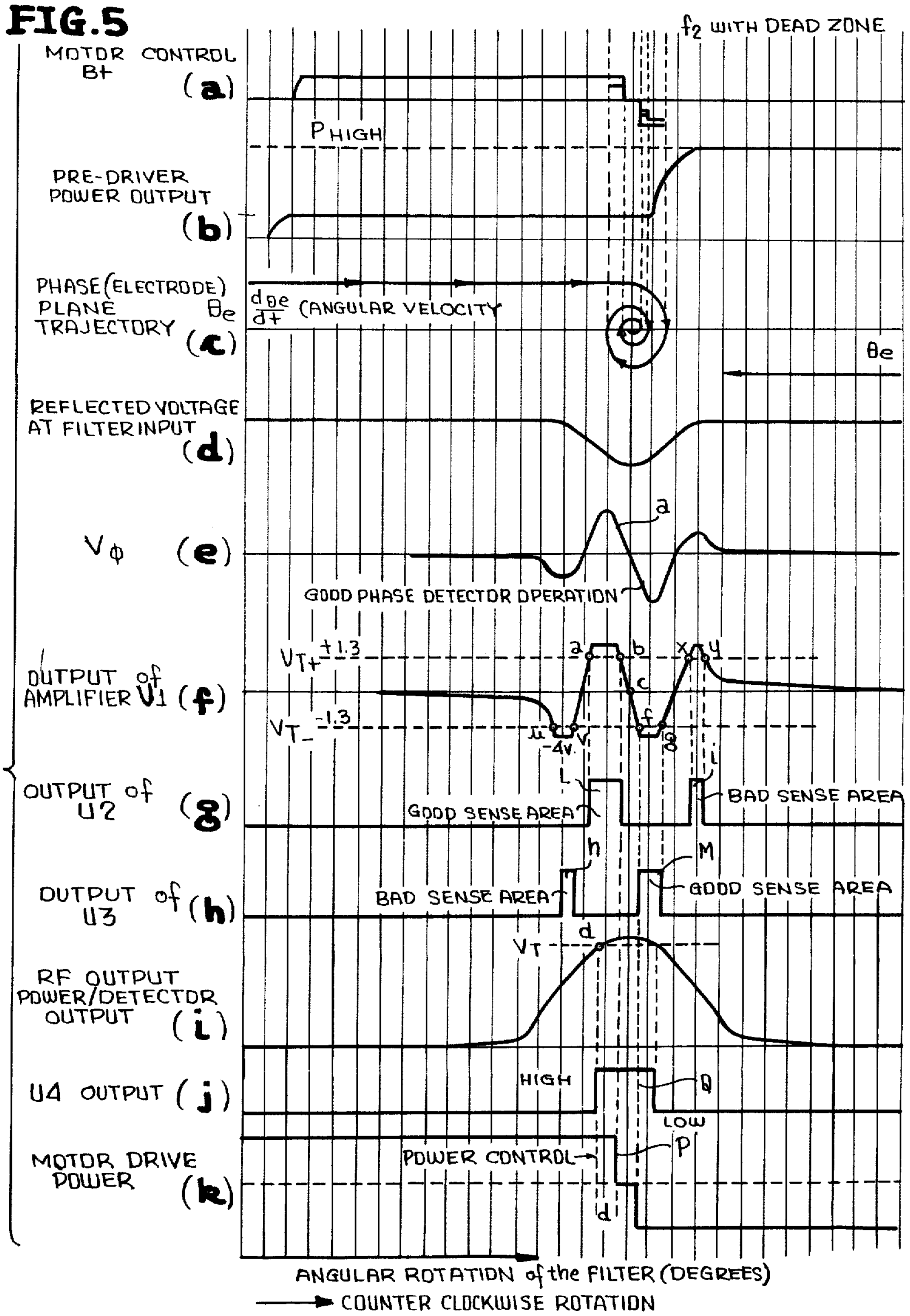
FIG. 5 is a set of curves illustrating operation of the system of FIG. 4.

Referring to FIG. 5, curve i is the response curve of the filter 15 as it is tuned, and curve d its reflected output. Starting from the left, there is zero output until the filter is nearly tuned. This is reflected at $U_4$, which provides high output to pin 13 of $U_8$, and a high on pin 12 of $U_8$ exists from $S_1$, only when the filter is nearly tuned on the proper side. Plot *d* shows the decrease in detected dc voltage on lead 70 due to reflected power as resonance is approached and it is the difference between plots *d* and *i* that is measured by $U_4$, i.e., $U_4$ detects a rise in output and a drop in reflected signal.

Referring to FIG. 4, comparator $U_4$ responds to the voltages of plots *d* and *i*. At the same time phase detector 60 provides no output so long as the filter is sufficiently detuned since its output is zero if either of its inputs is zero. As the filter approaches resonance and delivers output, the phase detector 60 goes through several zeros due to the fact that the filter 15 is a cascade of three resonant circuits, all tracking. Amplifier $U_1$ is protected against undue signal levels from $U_4$, both positively and negatively, due to the action of diodes 61, $U_1$ having a gain of about 130, and providing a maximum output of plus or minus 4. Vdc. While the output of $U_1$ is more negative than −1.3V the output of comparator $U_3$ is −3.V, but falls to −0.5V, which is clamped to −0.2V dc by CR5 (FIG. 6) to protect logic gate $U_6$, when the output of $U_1$ becomes more positive than −1.3 V. As the filter tunes through resonance the output of $U_1$ changes polarity and when the output attains +1.3V the output of comparator $U_2$ goes high. Between +1.3V and −1.3V at the output of $U_1$ the outputs of $U_2$ and $U_3$ are both low. The outputs of either $U_2$ or $U_3$ can be positive, but they occur in alternation with gaps as the filter tunes through its range. (See plots g and h of FIG. 5). Only a decreasing zone on the plot of output of $U_1$ represents the tuned zone, and only that portion of the plot corresponding with *a* of FIG. 5e but several plot portions of decreasing slope occur, and it becomes essential to select the portion *a* from among the other correctly sloped portions of the plot.

Figure 7:
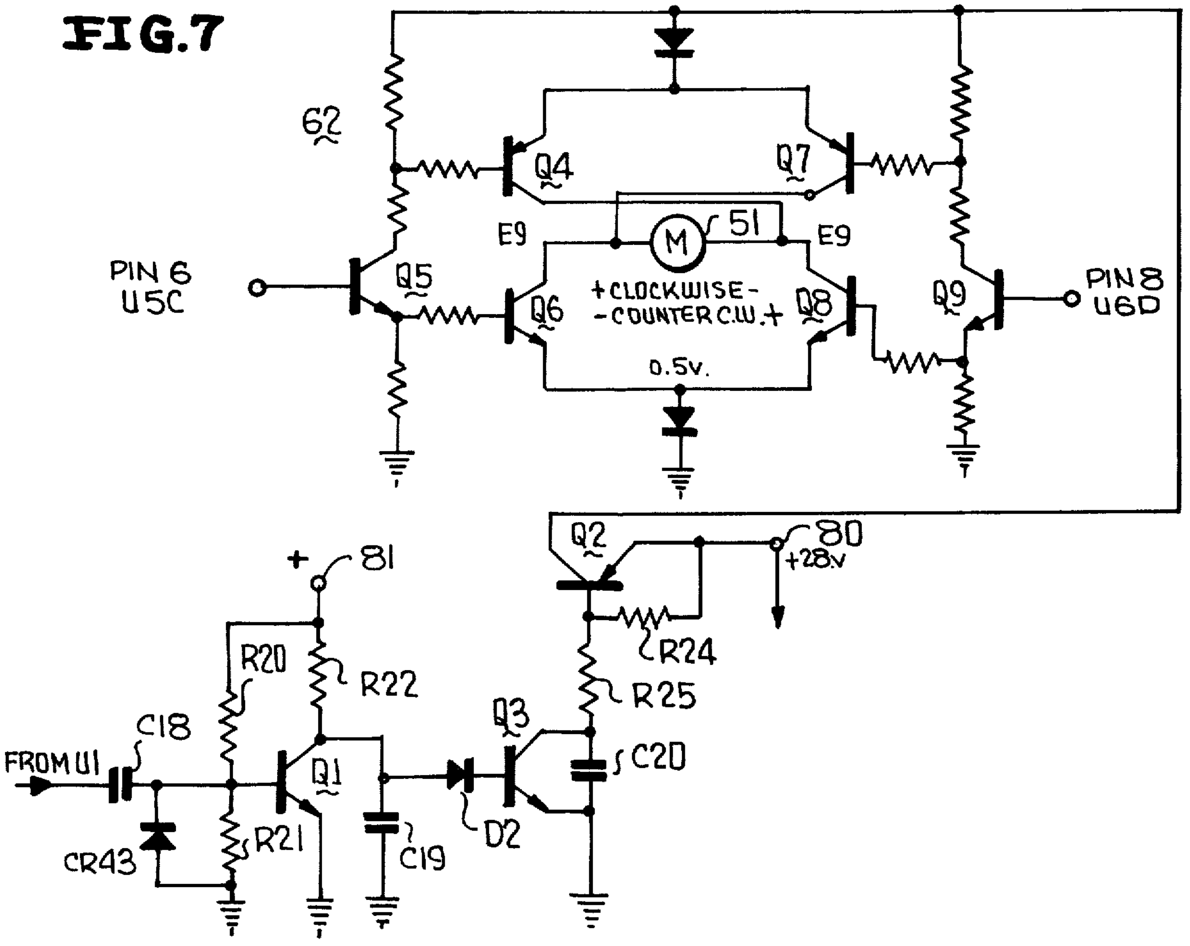
FIG. 7 is a schematic circuit diagram of motor control circuitry employed in the system of FIG. 4.

Input to logic element 50 (FIG. 4) then occurs at lines A and B, from $U_2$ and $U_3$, and on line C from $U_8$, an output is applied to motor control reversing switch 62, according as the motor is to be driven in one sense or another. Referring now to FIG. 7, power for motor 51 is applied via transistors $Q_1$, $Q_2$ and $Q_3$, which derive control signal from $U_1$. $U_1$ provides at its output, signal plotted at (*f*) of FIG. 5, which has a zero value except while the filter is almost tuned and is providing no output. Current to motor 51 is derived from terminal 80, at 28.V, via $Q_2$, which is normally conductive since its base is connected to terminal 80 through $R_{24}$ and $Q_3$ is conductive which grounds the $C_{20}$ side of $R_{25}$. $Q_3$ is conductive because its base is connected to positive terminal 81 via $R_{22}$ and diode $D_2$. The base of $Q_2$ is biased just below $Q_2$ turn on.

As the filter zeros in during the tuning cycle, an ac signal is applied from $U_1$ through capacitor $C_{18}$ to the base of $Q_1$, following plot (*f*) in time. Over the positive half of the ac cycle caused by the hunting of the filter, $Q_1$ is turned on. This results in the dumping of the charge on $C_{19}$ to ground. The voltage providing positive bias on the base of $Q_3$ has therefore been interrupted. The collector of $Q_3$ increases its voltage toward 28.V, and $Q_2$ becomes an increasingly large impedance, dropping the voltage applied to the motor 51.

Figure 6:
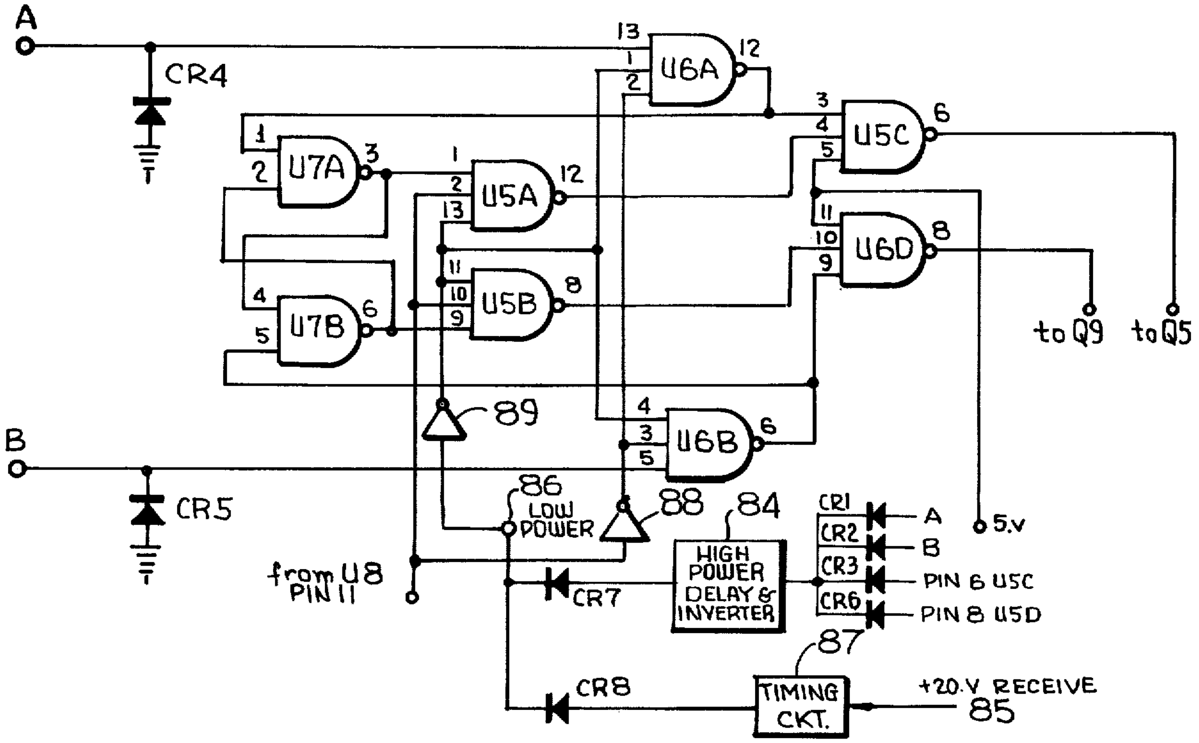
FIG. 6 is a logic diagram for the system of FIG. 4.

The motor control circuit further includes reversal circuitry including transistors $Q_4$, $Q_5$, $Q_6$, $Q_7$, $Q_8$ and $Q_9$ and the control logic circuitry of block 50, illustrated in detail in FIGS. 7 and 6.

Transistors $Q_4$ and $Q_7$ are PNP. All others are NPN. The logic circuitry provides drive that can be in one of three conditions. First, pin 6 of $U_{5C}$ can be high while pin 8 of $U_{6D}$ is low. In this state, the base of $Q_5$ is driven high which alsso drives the emitter of $Q_5$ and forces $Q_6$ into saturation which grounds the left side of the motor 51. As the collector $Q_5$ is driven toward ground, $Q_4$ is turned on into a saturated state. This therefore connects the right hand side of the motor 51 to the power source 80 through $Q_2$. With the low applied to the base of $Q_9$, the emitter of $Q_9$ is low and the collector is high. The low on the emitter of $Q_9$ forces $Q_8$ off, therefore, it is an open circuit. The collector voltage of $Q_9$ is high which forces $Q_7$ into an off state and it also is an open circuit. The result is that motor drive is counter-clockwise.

Secondly, pin 6 of $U_{5C}$ can be low and pin 8 of $U_{6D}$ high. As a result of low on the base of $Q_5$, $Q_6$ and $Q_4$ are both cut off. The high on the base of $Q_9$ however saturates $Q_9$, $Q_7$ and $Q_8$. Saturation of $Q_8$ places a ground at the right hand side of the motor 51 and $Q_7$ saturation supplies B+ from $Q_2$ to the left hand side of the motor. As a result, the motor drives clockwise.

The third condition that can occur during a tuning cycle is that both pin 6 of $U_{5C}$ and pin 8 of $U_{6D}$ can be low. This results in transistors $Q_4$, $Q_6$, $Q_7$ and $Q_8$ all being in the off state. As a result, no power is supplied to the motor.

In the receive mode no tuning occurs. The +28 volt power supply 80 is derived from the main 28 volt transmitter power supply. Time control circuits must provide appropriate timing control to guarantee that the receive B+ voltage goes to zero before the transmitter power is established. If the power supply 80 is not available, no motor drive power is available regardless of the state of any elements in the control logic.

When the system is switched to the transmit mode, the receive power supply voltage 85 goes from +20 volts to zero, and high voltage from terminal 85 is applied via timing circuit 87 and inverting amplifier 89, to pins 13 and 11 of $U_5$A and $U_5$B, and to pins 1 and 4 of $U_6$A and $U_6$B. The timing circuit 87 is an RC circuit which introduces a delay of 75 ms, to afford frequency synthesizer 10 time to arrive at any new frequency to which it may be tuned and the low power tune test is completed. The motor 51 therefore is not powered until the synthesizer 10 has located a frequency and the power/phase comparison circuitry involving the tuning logic has had time to check on the tuning of the filter. If the filter is not properly tuned, the tuning process then commences.

Pins 13 and 11 of $U_5$A, $U_5$B will be low because the timing circuit 87 holds the input to 89 high during the low power tune test. If the filter is badly detuned, the output of power sense gate $U_8$ is high and highs are applied to pins 2 and 10 of $U_5$A, $U_5$B. The output of $U_5$A and $U_5$B will thus depend on the state of pins 1 and 9 driven from $U_7$A and $U_7$B. Gates $U_7$A and $U_7$B are interconnected to provide a flip-flop which remembers the last direction of motor rotation during the previous tuning cycle.

The flip-flop is connected so that $U_7$A will be low and $U_7$B high for clockwise rotation. Just the opposite is the case for counter-clockwise rotation. Assume that the last direction of rotation was clockwise. Pin 1, $U_5$A will be low and pin 9 $U_5$B high. This results in $U_5$A output high which drives pin 4 $U_5$C high and $U_5$B output low; hence, pin 10 $U_6$D low. If the filter was far mistuned, there will be no output from $U_2$ or $U_3$, and lines A, B, pin 13 $U_6$A and pin 5 $U_6$B will be low. Pin 1 $U_6$A, 4 $U_6$B, 13 $U_5$A and 11 $U_5$B are high because the output of 89 is high. Pin 2 $U_6$A and pin 3 $U_6$B will be low because of inverter 88. Therefore, both $U_6$A and $U_6$B are high placing highs respectively on pin 3 $U_5$C and pin 9 $U_6$D. This results in clockwise motor drive which validates the assumption made above. The system at this point does not perceive in which direction to drive the motor, but in the event the wrong direction is chosen the switch $S_1$ will eventually close, which will provide a low at pin 12 of $U_8$ and disable the logic circuitry 50. The motor will then continue to turn until through its inactive 200°, come again into its active range, and eventually the filter will find the frequency of the signal being generated by synthesizer 10. As the filter approaches resonance, the conditions depicted in FIG. 5 exist.

Turning now to FIG. 5 which indicates various signal conditions in the filter as a function of filter angular rotation, curve (*i*) is the output or response curve of filter 15 as it is turned through resonance. Curve (*d*) shows the reflected voltage. Curve (*e*) represents the phase detector output of filter 15 and curve (*f*) represents the output of phase detector amplifier $U_1$. As the filter is tuned through resonance, the output of $U_1$ changes polarity and when the $U_1$ output reaches about +1.3V the output of $U_2$ goes high. Between the plus and minus 1.3V outputs of $U_1$, both $U_2$ and $U_3$ are low. Similarly when the $U_1$ output reaches −1.3V the output of $U_3$ goes high. This is illustrated in the relationship between curves *f*, *g* and *h*.

The decreasing zone between plus and minus 1.3V output of $U_1$ is defined as the tuned zone, i.e., the range *b* to *f* of curve (*f*).

The output of $U_1$ is acted on by $U_2$ and $U_3$ to establish the width of the tuned area by establishing thresholds $V_T+$ and $V_T-$ which determine points *b* and *f* of curve (*f*). A $+V_{ref}$ to $U_2$ and $-V_{ref}$ to $U_3$ of FIG. 4 establish respectively the $V_T+_{at}$ +1.3 volts and $V_T-$ at −1.3 volts as indicated in FIG. 5, curve (*f*).

When the input to $U_2$ from $U_1$ output exceeds $V_T+$ as indicated by *ab* and *xy* of curve (*f*), the output of $U_2$ goes high respectively for areas L and I. Similarly when $U_1$ output decreases below $V_T-$, the output of $U_3$ goes positive as per curves (*f*) and (*h*) with uv causing *h* and *fg* causing M.

Good sense areas L and M of $U_2$ and $U_3$ bracket the acceptable tune area *bcf* of curve (*f*).

However areas *h* and *i* represent mistuned areas. In order to eliminate the possibility of the filter locking on and tuning to one of these areas, the output of $U_4$ is also used.

Curve (*j*) represents the output of sense comparator $U_4$, which is low while an unacceptable ratio of forward to reverse power is being detected at the filter 15. The acceptable range falls between the 2. and 6. db points off the peak of the filter 15, and $U_4$ output goes high for this condition.

Assume now the motor drives the filter counterclockwise toward the tuned zone, the bad sense area associated with *uv* of curve (*f*) will be encountered. Pin 1 $U_5A$ will be high and pin 9 $U_5B$ low because of the counterclockwise stored rotation sense in $U_7A$ and $U_7B$. Pins 2, 10 of $U_5A$, $U_5B$ will both be high because nothing has occurred to change the state of $U_8$ which is high. Diodes CR1, CR2, CR3, and CR6 form an OR gate to hold the high power delay and inverter 84 low once the logic activates the tune cycle. This low can occur from a high from A, B, pin 6 $U_5C$ or pin 8 $U_6D$. Pin 6 $U_5C$ is high and therefore input through CR3 holds line 86 low provided the 20 volt receive has decayed to low through 87 and CR8. Pins 13 and 11 of $U_5A$ and $U_5B$ will be high because of the inverter 89. Therefore output of $U_5A$ is low and $U_5$ B is high which respectively hold pin 4 of $U_5C$ low and pin 10 high of $U_6D$. Because of the relationship previously established which is unchanged, pin 1 $U_5A$ and pin 4 $U_6B$ are high; pin 2 $U_6A$ and pin 3 $U_6B$ are low. Pin 13 $U_6A$ is low because $U_2$ output is low. However, pin 5 $U_6B$ is high because of the bad sense area *h* of curve (*h*). The outputs of $U_6A$ and $U_6B$ will be high because of the input conditions. Outputs from $U_5A$, $U_5B$, $U_6A$ and $U_6B$ produce inputs to $U_5C$ and $U_6D$ such that $U_5C$ is high and $U_6D$ is low. Therefore the motor continues to drive counterclockwise in spite of the bad sense area.

The system looks for coincidence between the $U_4$ output and a point between *b* and *f* of the $U_1$ output, i.e., a point between the good responses, L and M. So long as $U_4$ provides a low output, $U_6A$ and $U_6B$ are disabled from $U_8$ and the motor continues its rotation, $U_8$ output being inverted by amplifier 88, and the fact that the output of phase detector threshold amplifiers $U_2$ and $U_3$ go high as per *i* and *h* of curves (*g*) and (*h*).

As the motor continues its rotation, the filter 15 approaches resonance. This results in the decrease of input reflected power and increase of output as shown by curves *d* and *i* respectively. This causes the output of $U_4$ to go high as the filter approaches resonance. $U_8$ changes state at this time going low since $U_4$ output forces pin 13 of $U_8$ high and the filter is tuned in the proper front side area or $S_1$ is open putting a high on pin 12 of $U_8$. At about this same angle of filter rotation, the phase detector goes positive, point *a* of curve (*f*). This in turn provides the high output of $U_2$ on line A represented by L on curve (*g*). 8 changes state at this time going low since $U_4$ output forces pin 13 of $U_8$ high and the filter is tuned in the proper front side area or $S_1$ is open putting a high on pin 12 of $U_8$. At about this same angle of filter rotation, the phase detector goes positive, point *a* of curve (*f*). This in turn provides the high output of $U_2$ on line A represented by L on curve (*g*). Note that line B is still low. Pins 2 $U_5A$ and 10 $U_5B$ are low and pins 2 $U_6A$ and 3 $U_6B$ are high because of the low from $U_8$ created by the good power sense condition and inverter 88. No change has occurred in pins 13 $U_5A$ and 3 $U_6B$ are high because of the low from $U_8$ created by the good power sense condition and inverter 88. No change has occurred in pins 13 $U_5A$, 11 $U_5B$, 1 $U_6A$ and 4 $U_6$ B which are all high. Input conditions to $U_6A$ are pins 13 high, 1 high and 2 high; hence $U_6A$ is low. $U_6B$ is high because pin 5 is low.

Pins 3 and 4 of $U_5C$ are low and high respectively. Therefore $U_5C$ output is high. Pins 9 and 10 of $U_6D$ are high; therefore, $U_6D$ output is low. As a result, motor drive continues counterclockwise.

However, on the first pass through the good sense area L, the motor and filter are driven through into the tuned zone *bcf* of curve (*f*). Lines A and B are low resulting in lows on pins 13 $U_6A$ and 5 $U_6B$. None of the other inputs to these gates change. This forces both $U_6A$ and $U_6B$ high. Input conditions to $U_5C$ and $U_6D$ therefore drive both outputs low. In turn no motor drive power is applied in this tuned zone. high. U Momentum of the motor will carry the motor through the tuned zone into the good sense area M of curve (*h*). Now pin 5 $U_6B$ is driven high; 13 $U_6A$ is low. None of the other inputs to $U_6A$ and $U_6B$ change. As a result $U_6A$ goes high and $U_6B$ low. Pin 1 $U_7A$ is driven high, pin 5 $U_7B$ low. Thus motor direction sense is now oriented for clockwise rotation. $U_5A$ and $U_5B$ are both high. $U_5A$, U5B, $U_6A$, and $U_6B$ inputs drive $U_5C$ low and $U_6D$ high. Power to the motor results in a deceleration until angular velocity goes to zero and reverses to drive the motor back toward the tuned zone.

At the same time, the pulses in the time domain that occurred as the phase detector and $U_1$ were driven through the tuned zone initiates through $Q_1$, $Q_3$ and $Q_2$ the start of the motor power supply shut down.

Had the motor momentum carried the motor/filter past the good sense area M even to the bad sense area I, the motor drive power would have been clockwise to drive back to the tuned zone. The logic operates very similarly to inhibit tuning to *i* curve (*g*) as *h* of curve (*h*) with the exception that motor direction stored in $U_7A$ and $U_7B$ is clockwise.

This whole process continues while the B+ supply to the motor is decaying as shown in curve (*a*). The result is the phase trajectory shown in curve (*c*). As the B+ decays the angular velocity of the motor decreases because motor torque is a function of applied voltage.

The above described process is repeated, continually driving the filter 15 back into the tuned zone, from opposite directions. However, the voltage applied from $U_1$ is applied via capacitor C18, and continually reduces the drive voltage applied to the motor, lowering its speed and torque. This implies that the motor cannot pick up full speed and therefore has less momentum and for each reversal does not overdrive as much as it had in a previous reversal. The filter is usually driven back and forth through the tuned zone for about 1.2 seconds, with a phase trajectory shown in curve (*c*), the drive voltage being reduced on each reversal until only about 4. to 8.V remain to drive the motor 50, whereupon it stops and the filter is then in the tuned zone.

While in the dead zone, no signals are high on lines A, B, pin 6 $U_5C$, pin 8 $U_6D$ or the +20 volt receive line 85. The lows into CR1, CR2, CR3, CR6 and CR8 are inverted by inverter 89 so that pins 11 $U_5B$, 13 $u_5A$, 1

$U_6A$, 4 $U_6B$ are all high. $U_5A$, $U_5B$, $U_6A$, and $U_6B$ are all high. Highs on pins 3 and 4 of $U_5C$ and pin 9 and 10 of $U_6D$ result, but pin 5 $U_5C$ and 11 $U_6D$ are high. As a result, the output of both $U_5C$ and $U_6D$ are low. Motor power thus is inhibited.

At this point, one may switch into the high power mode of operation whereby switch 42 again connects Class C stages 13 in the predriver 11 to the filter 15.

The whole tuning process takes about 2 seconds even over environmental conditions from −30° to +60°C. The dead zone was adjusted to about ±15 electrical degrees which is about 2 minutes of mechanical shaft rotation as measured by the phase detector 60. This provided tuning within pass band of the filter within 0.1 db of the peak response curve (*i*).

What is claimed is:

1. A multi-channel radio transmitter, comprising a source of radio frequency signal tunable over a band including plural megacycles, a predriver amplifier having a substantially equal response over the entirety of said band, a band pass filter tunable over said band and having a narrow band width connected in cascade with said pre-driver amplifier, a broad band power amplifier connected in cascade with said filter, said broad band power amplifier having a substantially equal response over said band of frequencies, and an antenna coupled to said broad band amplifier, wherein said pre-driver amplifier and said broad band amplifier are transistor amplifiers, wherein said filter is a cavity resonator filter having plural resonant helix cavities coupled in cascade, and wherein is included means for automatically tuning said filter to the frequency of said source of radio frequency for any frequency in said band, said filter having three adjacent output settings for which phase difference between input and output terminals of said filter equals 0° in response to a single input frequency to said filter, and said means for automatically tuning includes means for setting said tuning to equal only the central one of said adjacent settings to the exclusion of remaining ones of said three adjacent settings.

2. The combination according to claim 1, wherein said predriver amplifier includes a Class A amplifier in cascade with a Class C amplifier, means for connecting said Class A amplifier to drive said filter during operation of said means for automatically tuning in performing a tuning operation and for connecting said Class C amplifier to drive said filter only while said filter is in tune.

3. The combination according to claim 2, wherein is included mean responsive to said means for connecting said Class A amplifier for initiating a tuning operation of said filter by said means for automatically tuning.

4. The combination according to claim 3, wherein is included a source of modulating signal and means for amplitude modulating said Class C amplifier in response to said modulating signal.

5. The combination according to claim 4, wherein is included means for deriving radio frequency output power from said broad band amplifier, means for detecting said radio frequency output power to derive a first modulating signal, a source of second modulating signal, means responsive to comparison of said first and second modulating signals for deriving an error signal, and means for modulating said Class C amplifier in response to said error signal.

6. The combination according to claim 4, wherein is included means operable during tuning of said filter for comparing amplitudes of signals respectively reflected from the input and derived from the output of said filter until the signal provided by said source of radio frequency signal falls within the pass band of said filter, and means for thereafter comparing phases of said signals at the input and output of said filter until said filter is centrally tuned to said radio frequency signal.

7. A system for tuning a narrow band filter to the frequency of a signal applied to the input of the filter, comprising a predriver amplifier for applying said signal to said input of said filter, said predriver amplifier including a Class A amplifier section driving a Class C amplifier section, and means for driving said filter from only said Class A amplifier during tuning of said filter and from said Class C amplifier only following completion of said tuning.

8. The system according to claim 7, wherein is further included means for amplitude modulating said Class C amplifier in response to a modulating signal.

9. The system according to claim 7, wherein said filter is a cascade of plural resonant cavities, and means for controlling tuning of said filter in response to phase comparison of signal at the input and output of said filter.

10. In a filter module, a source of a selectible frequency carrier signal, a narrow band tunable filter in cascade with said source, an r.f. power amplifier in cascade with said tunable filter, said r.f. power amplifier being sufficiently wide band to transfer signals over the entire tuning range of said filter, said filter being a cascade of helix cavity filters tunable capacitively, a rotating reversible motor connected to capacitively tune said filters concurrently, said filters having plural zeros of phase difference between input and output at different tunings in response to said carrier signal, only one of said zeros representing accurate tuning to the frequency of said carrier signal, a normally disabled logic means, means responsive to said output only when said output has attained a predetermined level for enabling said logic means, means for continuously sensing the phase difference between output and input of said filter, said phase difference achieving at least two maxima on either side of said frequency of said source during said continuous sensing and in response to said carrier signal, means for sensing said maxima and for generating limit control signals in response thereto, and means responsive to said limit control signals for driving said motor in reversing steps of decreasing magnitude to a location corresponding with tuning of said filter to a frequency at said only one of said zeros.

11. The combination according to claim 10, wherein said filters have a proper tuning range of approximately 160°, and wherein is provided means responsive to the position of said motor for disabling said logic means except while said filters are within said proper tuning range.

12. In combination, a source of signals selective over a wide band of frequencies covering at least thousands of communication channels, a filter tunable over said band of frequencies, a broad band untuned amplifier coupling said source to said filter, said amplifier being a transistor amplifier operating Class C and subject to burn out when operating into a substantially short circuit, means operative to provide one of said signals corresponding with one of said channels from said source, a motor controlled tuner for said filter, means responsive to operation of said means for initiation of a tuning operation of said filter by starting said motor controlled tuner while said Class C amplifier is disconnected from said tank circuit, means for sensing the existence of a predetermined ratio of amplitude of signal reflected from the input of and derived from the output of said filter and for sensing the existence of a predetermined phase difference between signal at said input and at said output, means responsive to said means for sensing for terminating said tuning operation, means for thereafter reconnecting said broad band untuned amplifier to said filter.

* * * * *